United States Patent
Jin et al.

(12)

(10) Patent No.: US 10,795,042 B2
(45) Date of Patent: Oct. 6, 2020

(54) ULTRASONIC TRANSDUCER WITH SUPPRESSED LATERAL MODE

(71) Applicant: Halliburton Energy Services, Inc., Houston, TX (US)

(72) Inventors: Jing Jin, Singapore (SG); Yao Ge, Singapore (SG)

(73) Assignee: Halliburton Energy Services, Inc., Houston, TX (US)

( * ) Notice: Subject to any disclaimer, the term of this patent is extended or adjusted under 35 U.S.C. 154(b) by 308 days.

(21) Appl. No.: 15/765,597

(22) PCT Filed: Nov. 24, 2015

(86) PCT No.: PCT/US2015/062413
§ 371 (c)(1),
(2) Date: Apr. 3, 2018

(87) PCT Pub. No.: WO2017/091212
PCT Pub. Date: Jan. 6, 2017

(65) Prior Publication Data
US 2020/0003924 A1    Jan. 2, 2020

(51) Int. Cl.
*G01V 1/00* (2006.01)
*G01V 1/52* (2006.01)
(Continued)

(52) U.S. Cl.
CPC .............. *G01V 1/52* (2013.01); *B06B 1/0655* (2013.01); *E21B 49/00* (2013.01); *G01V 1/159* (2013.01);
(Continued)

(58) Field of Classification Search
USPC ............................................................ 367/7
See application file for complete search history.

(56) References Cited

U.S. PATENT DOCUMENTS

| 2,956,184 A | 10/1960 | Pollack |
| 3,020,424 A | 2/1962 | Bechman |

(Continued)

FOREIGN PATENT DOCUMENTS

| EP | 0142215 A2 | 5/1985 |
| JP | S57132497 A | 8/1982 |
| WO | 2010/080355 A2 | 7/2010 |

OTHER PUBLICATIONS

International Preliminary Report on Patentability in related PCT application No. PCT/US2015/062413 dated Jun. 7, 2018, 13 pages.
(Continued)

*Primary Examiner* — James R Hulka
(74) *Attorney, Agent, or Firm* — John W. Wustenberg; Baker Botts L.L.P.

(57) ABSTRACT

An ultrasonic transducer may comprise a transducer body including a first face and a second face disposed on opposite sides of the transducer body, wherein the transducer body comprises a piezoelectric material; a first transducer edge disposed on the transducer body; and a second transducer edge disposed on the transducer body, wherein the first edge is disposed on the transducer body substantially opposite from the second edge, and wherein the first and second transducer edges intersect a perimeter of the transducer body, and wherein the first and second edge forms an angle no less than 3 degrees.

20 Claims, 6 Drawing Sheets

(51) Int. Cl.
*B06B 1/06* (2006.01)
*E21B 49/00* (2006.01)
*G01V 1/02* (2006.01)
*G01V 1/44* (2006.01)
*H01L 41/187* (2006.01)
*H01L 41/333* (2013.01)
*E21B 47/002* (2012.01)
*E21B 47/005* (2012.01)

(52) U.S. Cl.
CPC ............ *G01V 1/44* (2013.01); *H01L 41/1876* (2013.01); *H01L 41/333* (2013.01); *B06B 2201/30* (2013.01); *B06B 2201/73* (2013.01); *E21B 47/002* (2020.05); *E21B 47/005* (2020.05)

(56) References Cited

U.S. PATENT DOCUMENTS

| | | | |
|---|---|---|---|
| 4,156,158 A | 5/1979 | Wilson et al. | |
| 5,174,296 A | 12/1992 | Watanabe et al. | |
| 5,175,709 A | 12/1992 | Slayton et al. | |
| 5,182,485 A | 1/1993 | de la Fonteijne | |
| 5,191,796 A | 3/1993 | Kishi et al. | |
| 5,995,453 A | 11/1999 | Hirata | |
| 6,057,632 A | 5/2000 | Ustuner | |
| 6,370,086 B2* | 4/2002 | Li | G01S 7/521 310/334 |
| 6,669,644 B2 | 12/2003 | Miller | |
| 7,036,363 B2 | 5/2006 | Yogeswaren | |
| 8,164,982 B2 | 4/2012 | Okuda et al. | |
| 8,310,133 B2 | 11/2012 | Brown et al. | |
| 8,671,762 B2* | 3/2014 | Reiche | G10K 9/22 73/633 |
| 9,224,938 B2* | 12/2015 | Maki, Jr. | B06B 1/0651 |
| 9,393,597 B2* | 7/2016 | Clark | B06B 1/0637 |
| 9,567,846 B2* | 2/2017 | Leggett, III | E21B 47/011 |
| 2001/0040839 A1 | 11/2001 | Li | |
| 2003/0028106 A1* | 2/2003 | Miller | B06B 1/0292 600/437 |
| 2003/0173870 A1 | 9/2003 | Hsu | |
| 2005/0000279 A1 | 1/2005 | Yogeswaren | |
| 2011/0259107 A1 | 10/2011 | Reiche | |
| 2011/0261651 A1* | 10/2011 | Okuda | B06B 1/0629 367/93 |
| 2011/0273059 A1* | 11/2011 | Brown | B06B 1/0622 310/334 |
| 2013/0012841 A1 | 1/2013 | Clark | |
| 2013/0200756 A1 | 8/2013 | Maki, Jr. | |
| 2013/0331705 A1 | 12/2013 | Fraser | |
| 2015/0204993 A1 | 7/2015 | Leggett, III et al. | |

OTHER PUBLICATIONS

Extended European Search Report issued in related European Application No. 15909405.1, dated Apr. 24, 2018, (7 pages).
Wang, Haifeng, and Wenwu Cao. "Finite element study of 2-2 piezocomposite transducer with random polymer properties." Medical Imaging 2003: Ultrasonic Imaging and Signal Processing. vol. 5035. International Society for Optics and Photonics, 2003.
International Search Report and Written Opinion issued in related PCT Application No. PCT/US2015/062413 dated Aug. 26, 2013, 16 pages.

\* cited by examiner

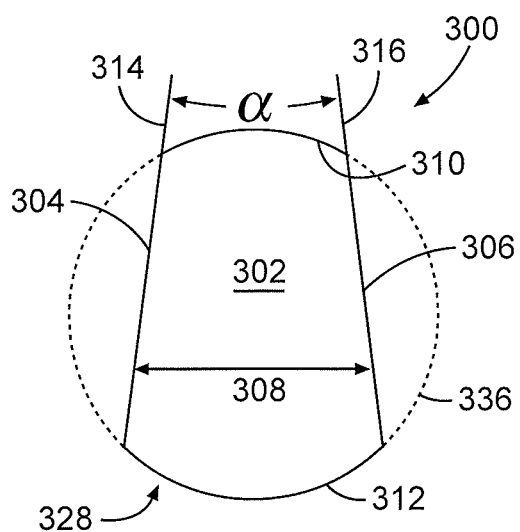
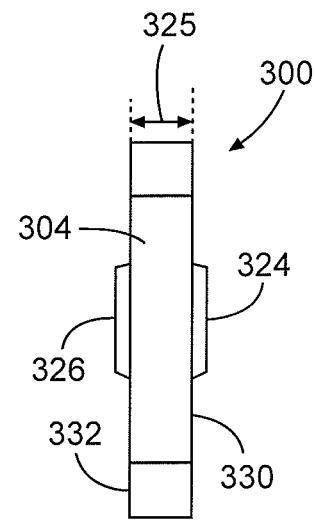
Fig. 4A          Fig. 4B
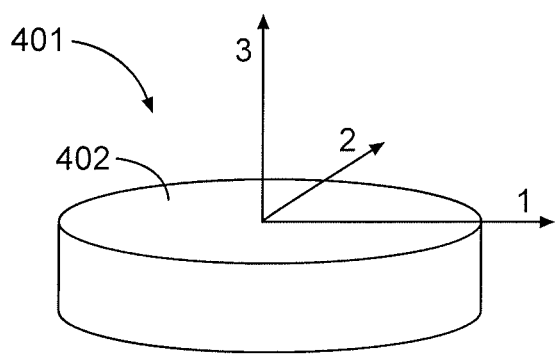
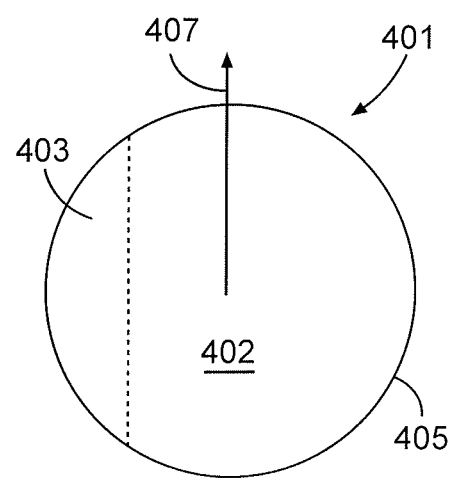
Fig. 5A          Fig. 5B

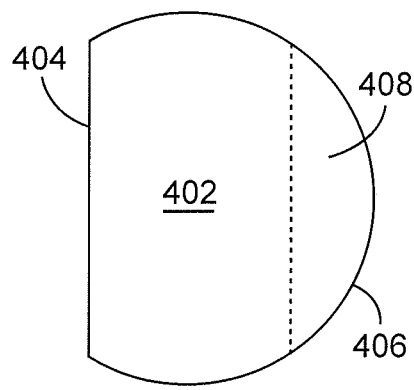
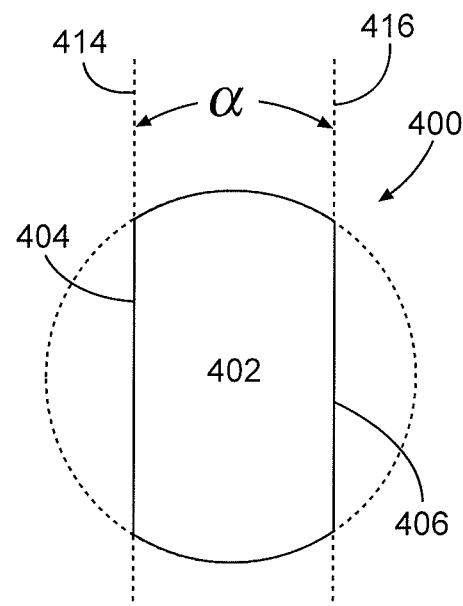
Fig. 5C     Fig. 5D
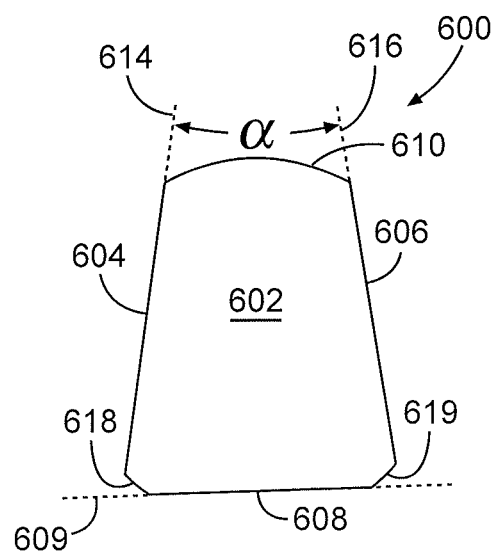
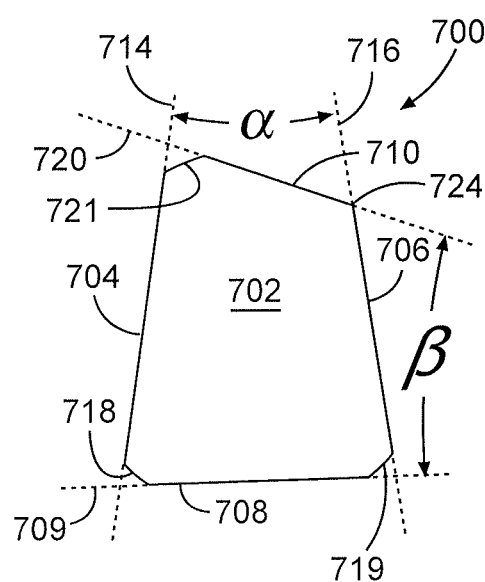
Fig. 6     Fig. 7

# US 10,795,042 B2

ULTRASONIC TRANSDUCER WITH SUPPRESSED LATERAL MODE

CROSS-REFERENCE TO RELATED APPLICATION

The present application is a U.S. National Stage Application of International Application No. PCT/US2015/062413 filed Nov. 24, 2015, which is incorporated herein by reference in its entirety for all purposes.

BACKGROUND

The present disclosure relates generally to well drilling operations and, more particularly, to ultrasonic imaging operations.

Hydrocarbons, such as oil and gas, are commonly obtained from subterranean formations that may be located onshore or offshore. The development of subterranean operations and the processes involved in removing hydrocarbons from a subterranean formation are complex. Typically, subterranean operations involve a number of different steps such as, for example, drilling a wellbore at a desired well site, treating the wellbore to optimize production of hydrocarbons, and performing the necessary steps to produce and process the hydrocarbons from the subterranean formation. During a wellbore drilling operation, information regarding the composition of the formation through which the wellbore is drilled may be collected either while the wellbore is being drilled or after a portion of the wellbore has been drilled. This information may be generated using one or more sensors positioned within the wellbore, for instance. One example sensor is an ultrasonic transducer that may generate measurements for ultrasonic imaging, which may be used to measure casing thickness, evaluate cement for cased holes, and evaluate aspects of the formation.

Typical ultrasonic transducers are composed of a piezoelectric material and are formed and excited to generate longitudinal ultrasound waves in a "thickness mode" to generate ultrasonic images. A transducer made of a relatively flat plate of excitable material, for instance, may operate in the "thickness mode" to emit ultrasound waves in a direction normal to the surface of the plate. When excited, however, transducers operating in the thickness mode may also vibrate in a lateral mode, which introduces noise into the longitudinal wave signal and can interfere with the ultrasonic imaging process.

FIGURES

Some specific exemplary embodiments of the disclosure may be understood by referring, in part, to the following description and the accompanying drawings.

FIG. 4A is a top-view schematic showing an illustrative transducer body comprising a first edge and a second edge, according to aspects of the present disclosure.

FIG. 4B is a side-view schematic showing an illustrative transducer body comprising a first edge and a second edge, according to aspects of the present disclosure.

FIG. 5A is a diagram showing a transducer body having a disk-shaped geometry, according to aspects of the present disclosure.

FIG. 5B is a top-view schematic showing a transducer body having a disk-shaped geometry, according to aspects of the present disclosure.

FIG. 5C is a top-view schematic showing a transducer body having a disk-shaped geometry comprising a first edge interrupting its circumference, according to aspects of the present disclosure.

FIG. 5D is a top-view schematic showing a transducer body having a disk-shaped geometry comprising a first edge and a second edge interrupting its circumference, according to aspects of the present disclosure.

FIG. 6 is a diagram showing an illustrative transducer body comprising two edges slanted toward each other and a third edge further interrupting the radial portion, according to aspects of the present disclosure.

FIG. 7 is a diagram showing an illustrative transducer body comprising a pair of edges slanted toward each other and second pair of edges slanted toward each other, according to aspects of the present disclosure.

Figure 1:
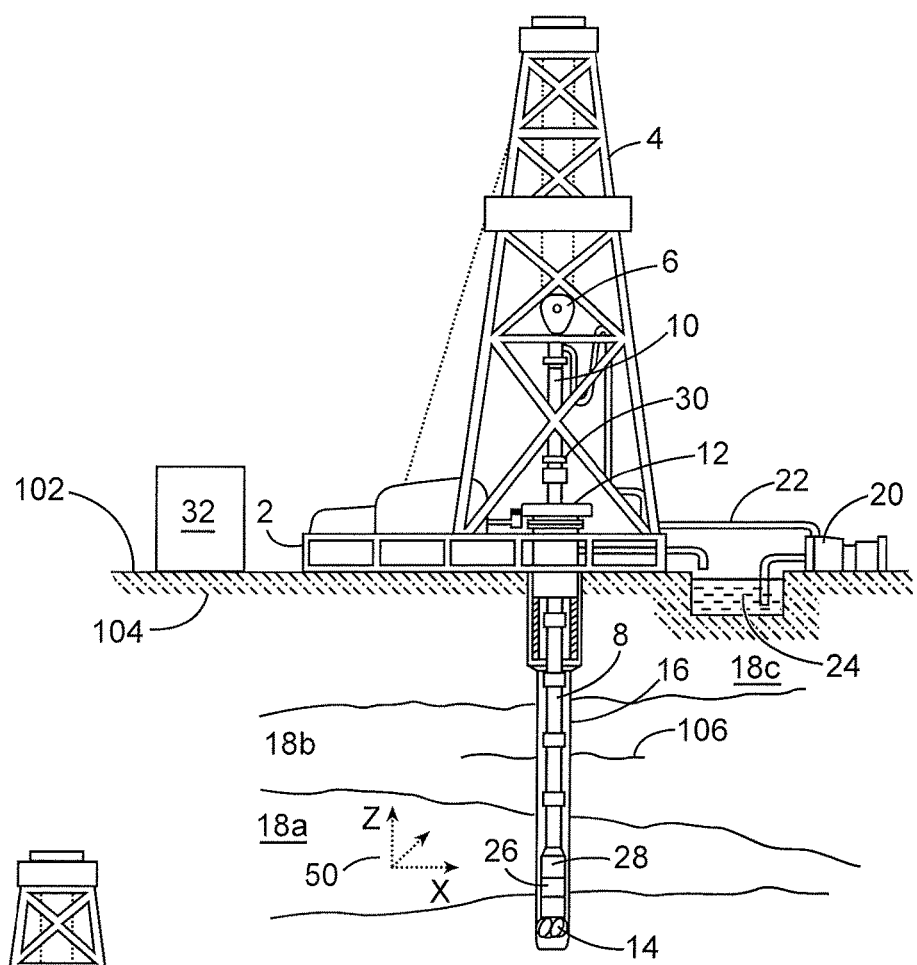
FIG. 1 is a diagram showing an illustrative logging while drilling environment, according to aspects of the present disclosure.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DETAILED DESCRIPTION

The present disclosure relates generally to well drilling operations and, more particularly, to ultrasonic imaging operations.

The present disclosure provides methods and systems for using an ultrasonic transducer with a suppressed lateral mode. As a result, measurements taken by the transducer may have an increased signal to noise ratio. For the purposes of the present disclosure and ease of explanation, radius mode excitation of a transducer may be considered to be a form of lateral mode excitation involving radial geometry.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components. It may also include one or more interface units capable of transmitting one or more signals to a controller, actuator, or like device.

For the purposes of this disclosure, computer-readable media may include any instrumentality or aggregation of instrumentalities that may retain data and/or instructions for a period of time. Computer-readable media may include, for example, without limitation, storage media such as a direct access storage device (e.g., a hard disk drive or floppy disk drive), a sequential access storage device (e.g., a tape disk drive), compact disk, CD-ROM, DVD, RAM, ROM, electrically erasable programmable read-only memory (EEPROM), and/or flash memory; as well as communications media such wires, optical fibers, microwaves, radio waves, and other electromagnetic and/or optical carriers; and/or any combination of the foregoing.

Illustrative embodiments of the present disclosure are described in detail herein. In the interest of clarity, not all features of an actual implementation may be described in this specification. It will of course be appreciated that in the development of any such actual embodiment, numerous implementation-specific decisions are made to achieve the specific implementation goals, which will vary from one implementation to another. Moreover, it will be appreciated that such a development effort might be complex and time-consuming, but would, nevertheless, be a routine undertaking for those of ordinary skill in the art having the benefit of the present disclosure.

To facilitate a better understanding of the present disclosure, the following examples of certain embodiments are given. In no way should the following examples be read to limit, or define, the scope of the invention. Embodiments of the present disclosure may be applicable to horizontal, vertical, deviated, or otherwise nonlinear wellbores in any type of subterranean formation. Embodiments may be applicable to injection wells as well as production wells, including hydrocarbon wells. Embodiments may be implemented using a tool that is made suitable for testing, retrieval and sampling along sections of the formation. Embodiments may be implemented with tools that, for example, may be conveyed through a flow passage in tubular string or using a wireline, slickline, coiled tubing, downhole robot or the like. "Measurement-while-drilling" ("MWD") is the term generally used for measuring conditions downhole concerning the movement and location of the drilling assembly while the drilling continues. "Logging-while-drilling" ("LWD") is the term generally used for similar techniques that concentrate more on formation parameter measurement. Devices and methods in accordance with certain embodiments may be used in one or more of wireline (including wireline, slickline, and coiled tubing), downhole robot, MWD, and LWD operations.

The terms "couple" or "couples" as used herein are intended to mean either an indirect or a direct connection. Thus, if a first device couples to a second device, that connection may be through a direct connection or through an indirect mechanical or electrical connection via other devices and connections. Similarly, the term "communicatively coupled" as used herein is intended to mean either a direct or an indirect communication connection. Such connection may be a wired or wireless connection such as, for example, Ethernet or LAN. Such wired and wireless connections are well known to those of ordinary skill in the art and will therefore not be discussed in detail herein. Thus, if a first device communicatively couples to a second device, that connection may be through a direct connection, or through an indirect communication connection via other devices and connections.

FIG. 1 is a diagram of a subterranean drilling system 100, according to aspects of the present disclosure. The drilling system 100 comprises a drilling platform 2 positioned at the surface 102. In the embodiment shown, the surface 102 comprises the top of a formation 104 containing one or more rock strata or layers 18a-c, and the drilling platform 2 may be in contact with the surface 102. In other embodiments, such as in an off-shore drilling operation, the surface 102 may be separated from the drilling platform 2 by a volume of water.

The drilling system 100 comprises a derrick 4 supported by the drilling platform 2 and having a traveling block 6 for raising and lowering a drill string 8. A kelly 10 may support the drill string 8 as it is lowered through a rotary table 12. A drill bit 14 may be coupled to the drill string 8 and driven by a downhole motor 34 and/or rotation of the drill string 8 by the rotary table 12. As bit 14 rotates, it creates a borehole 16 that passes through one or more rock strata or layers 18a-c.

A pump 20 may circulate drilling fluid through a feed pipe 22 to kelly 10, downhole through the interior of drill string 8, through orifices in drill bit 14, back to the surface via the annulus around drill string 8, and into a retention pit 24. The drilling fluid transports cuttings from the borehole 16 into the pit 24 and aids in maintaining integrity or the borehole 16. In certain embodiments, the downhole motor 34 may comprise a turbine motor.

The drilling system 100 may comprise a bottom hole assembly (BHA) coupled to the drill string 8 near the drill bit 14. The BHA may comprise various downhole measurement tools and sensors and LWD and MWD elements, including an ultrasonic imaging system 26. The ultrasonic imaging system 26 may comprise at least one ultrasonic transducer with a suppressed lateral mode (not shown), that will be described in detail below. The at least one ultrasonic transducer with a suppressed lateral mode may be configured to generate one or more ultrasonic images of the borehole 16 and/or formation 18a-c, or of other downhole structures that may be present in a typical drilling operation. In certain embodiments, the orientation and position of the drill bit 14 and/or the ultrasonic imaging system 26 may be tracked using, for example, an azimuthal orientation indicator, which may include magnetometers, inclinometers, and/or accelerometers, though other sensor types such as gyroscopes may be used in some embodiments.

In certain embodiments, the ultrasonic imaging system 26 may also include a control unit (not shown) that controls the operation of the system 26, stores measurements generated by the system 26, and in certain instances processes measurements to generate ultrasonic images. Example control units may include microcontrollers and microcomputers and any other device that contains at least one processor communicably coupled to memory devices containing a set of instructions that when executed by the processor, cause it to perform certain actions. In certain embodiments, a control unit of the ultrasonic imaging system 26 may be communicably coupled to other controllers within the BHA.

The tools and sensors of the BHA including the ultrasonic imaging system 26 may be communicably coupled to a telemetry element 28. The telemetry element 28 may transfer measurements from the ultrasonic imaging system 26 to a surface receiver 30 and/or to receive commands from the surface receiver 30. The telemetry element 28 may comprise a mud pulse telemetry system, acoustic telemetry system, wired communications system, wireless communications system, and/or any other type of communications system that would be appreciated by one of ordinary skill in the art in view of this disclosure. In certain embodiments, some or all of the measurements taken at the ultrasonic imaging system 26 may also be stored in a memory within the ultrasonic imaging system 26 or a memory in the telemetry element 28 for later retrieval at the surface 102.

In certain embodiments, the drilling system 100 may comprise an information handling system 32 positioned at the surface 102. The information handling system 32 may be communicably coupled to the surface receiver 30 and may receive measurements from the ultrasonic imaging system 26 and/or transmit commands to the ultrasonic imaging system 26 though the surface receiver 30. The information handling system 32 may also receive measurements from the ultrasonic imaging system 26, when retrieved at the surface 102.

Figure 2:
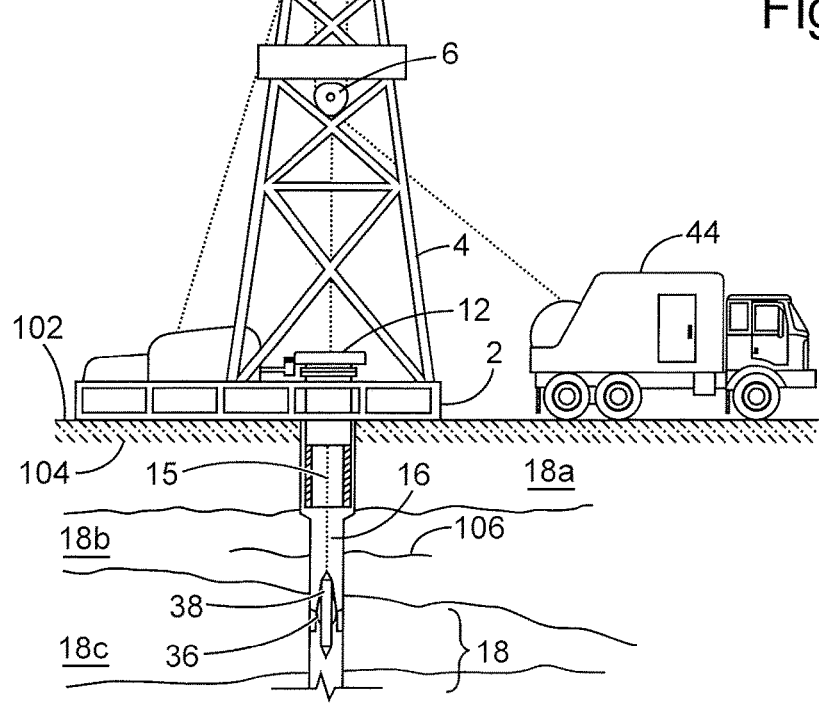
FIG. 2 is a diagram showing an illustrative wireline measurement system, according to aspects of the present disclosure.

At various times during the drilling process, the drill string 8 may be removed from the borehole 16 as shown in FIG. 2. Once the drill string 8 has been removed, measurement/logging operations can be conducted using a wireline tool 38, i.e., an instrument that is suspended into the borehole 16 by a cable 15 having conductors for transporting power to the tool and telemetry from the tool body to the surface 102. In certain embodiments, the wireline tool 38 may comprise an ultrasonic imaging system 36. A logging facility 44 (shown in FIG. 2 as a truck, although it may be any other structure) may collect measurements from the wireline tool 38, and may include computing facilities (including, e.g., a control unit) for controlling, processing, storing, and/or visualizing the measurements gathered by the ultrasonic imaging system 36. The computing facilities may be communicatively coupled to the wireline tool 38 by way of the cable 15. In certain embodiments, the surface control unit 32 may serve as the computing facilities of the logging facility 44.

Figure 3:
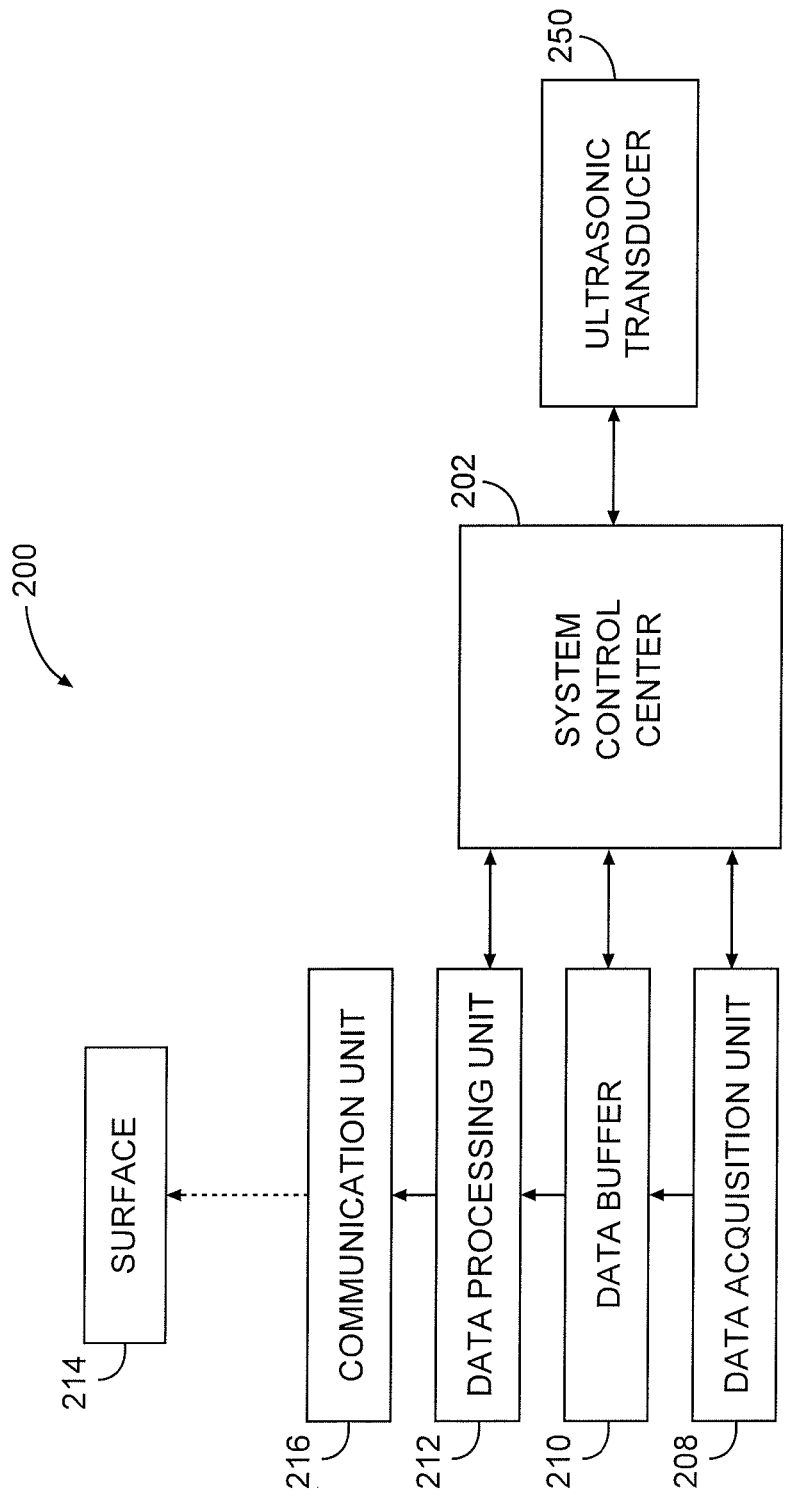
FIG. 3 is a diagram of an example control system for a downhole tool with at least one ultrasonic sensor, according to aspects of the present disclosure.

In certain embodiments, a control system associated with a downhole tool may control when and how the ultrasonic imaging system captures measurements. FIG. 3 is a diagram of an example control system 200 for a downhole tool with at least one ultrasonic transducer 250 coupled to the control unit 202.

The control unit 202 may trigger the ultrasonic transducer 250 to generate ultrasound waves using a control signal. For example, in certain embodiments, the control unit 202 may send control signals to the ultrasonic transducer 250, identifying the pressure wave frequency to generate, how often the pressure waves should be generated, and when the measurements should be taken. In certain embodiments, the ultrasonic transducer 250 may comprise a transceiver that is capable of both producing ultrasonic signals and measuring their echoes. In certain embodiments, the control signal may be a pulse-echo signal, or another suitable signal as discussed herein. In certain embodiments, the phase and amplitude of the control signal may be set at a desired value. The ultrasound waves generated by the ultrasonic transducer in response to the control signal may be emitted into the environment, for example a pipe, wellbore, and/or formation, and be reflected back to and received by the ultrasonic transducer 250. The character and delay of the received ultrasound waves may provide information regarding the character of the pipe, wellbore, and/or formation (e.g., structural information such as whether there is a hole in the pipe or a pocket in rock formation).

The control unit 402 may receive measurements from the ultrasonic sensor 250, and may transmit the measurements to the data acquisition unit 208. Upon reception at the data acquisition unit 208, the measurements may be digitized, stored in a data buffer 210, preprocessed at data processing unit 212, and sent to the surface 214 through a communication unit 216, which may comprise a downhole telemetry system. The control unit 202 may include instructions regarding the operation of the ultrasonic transducer 250 and may generate control signals to the ultrasonic transducer based, at least in part, on the instructions.

According to aspects of the present disclosure, the data measurements from the ultrasonic transducer of the downhole tool may be aggregated and processed to produce a visualization of one or more downhole elements. In certain embodiments, aggregating and processing the measurements may comprise aggregating and processing the measurements using a control unit located either within the downhole tool or the surface above the downhole tool. When processed at the surface, the measurements may be communicated to the surface in real time, such as through a wireline, or stored in a downhole tool and later processed when the tool is retrieved to the surface. In certain embodiments, aggregating and processing the measurements may comprise aggregating and processing the measurements using an inversion algorithm implemented as a set of instructions in the control unit that are executable by a processor of the control unit to perform data calculations and manipulations necessary for the inversion algorithm.

FIGS. 4A and 4B illustrate an example ultrasonic transducer 300 according to certain aspects of the present disclosure. In certain embodiments, the ultrasonic transducer 300 may be included as part of an ultrasonic imaging system similar to the ones incorporated into the drilling and wireline systems described above with reference to FIGS. 1-3.

The ultrasonic transducer 300 may comprise a transducer body 302. In certain embodiments, the transducer body 302 may comprise a perimeter 328. In certain embodiments, the transducer body 302 may comprise a generally cylindrical body having a circumference 336. As such, in certain embodiments, the transducer body perimeter 328 may comprise the circumference 336. The transducer body 302 may comprise a first face 330 and a second face 332 disposed on the opposite side of the transducer body 302 from the first face 330. In certain embodiments, a first electrode 324 may be disposed on the first face 330 and a second electrode 326 may be disposed on the second face 332. In certain embodiments, the first and second electrodes 324, 326 may be connected to the respective first and second faces 330, 332. A transducer thickness 325 may be defined between the first face 330 and the second face 332. In certain embodiments, the transducer thickness 325 may be substantially uniform. As a result, the first electrode 324 and the second electrode 326 may be uniformly separated from each other.

The transducer body 302 may be excited sending an input electrical signal to the electrodes 324, 326. For example, in certain embodiments the input electrical signal may be a square pulse, pulse-echo, variable frequency, pulse frequency signal, or any other signal suitable for exciting the ultrasonic transducer as would be recognized by one of ordinary skill in the art with the benefit of the present disclosure. For example, in certain embodiments, the input signal may be a 2 microsecond square pulse.

In certain embodiments, the transducer body 302 may comprise a first edge 304 and a second edge 306. In certain embodiments, the first and second edges 304, 306 may be planar. In certain embodiments, the first edge 304 may be disposed on the transducer body 302 substantially opposite from the second edge 306. In certain embodiments, the first edge 304 and the second edge 306 may intersect the transducer body perimeter 328. For example, in certain embodiments where the transducer body perimeter comprises a circumference 336, a first radial section 310 and a second radial section 312 may be disposed between the first edge 304 and the second edge 306.

The first edge and the second edge 304, 306 may break the transducer body perimeter 328 such that the first edge and the second edge 304, 306 each connect two portions of the transducer body perimeter 328. For example, in embodiments comprising a transducer body circumference, the first end of the first edge 304 may connect to the first radial section 310 and a second end of the first edge 304 may connect to the second radial section 312.

In certain embodiments, the first edge 304 and the second edge 306 may form an angle α of no less than about 3 degrees. For example, the first edge 304 may define a first plane 314 and the second edge 306 may define a second plane 316, where the first plane 314 and the second plane 316 are separated by an angle of no less than 3 degrees. In certain embodiments, the first plane 314 and the second plane 316 may be perpendicular to the first face 330 and the second face 332. As a result, in such embodiments, the first edge 304 and/or the second edge 306 may form a right angle with the first face 330 and the second face 332. In other embodiments, the first plane 314 and/or the second plane 316 may be oriented at an acute angle with respect to either the first face 330 or the second face 332.

In certain embodiments, a transducer width 308 may be defined between the first edge 304 and the second edge 306 of the transducer. For example, in certain embodiments, the transducer width 308 may be variable across the transducer body 302 due to the angle between the two planar edges no less than 3 degree.

The transducer body 302 may comprise an excitable material. In certain embodiments, the transducer body 302 may comprise a piezoelectric material. For example, in certain embodiments, the transducer body 302 may comprise Lead Zirconate Titanate (PZT), Lead Metaniobate, Lead Titanate, Lead Magnesium Niobate (PMN), Barium Titanate, and/or other suitable piezoelectric materials as would be understood by one of ordinary skill in the art with the benefit of the present disclosure. For additional discussion of suitable piezoelectric materials for use in the ultrasonic transducer, see Electro-Ceramic Products and Materials Specification, published by Exelis Inc, Salt Lake City, Utah (2013), the entirety of which is incorporated herein by reference.

In certain embodiments, the transducer body 302 may be comprised of piezoelectric material capable of generating an ultrasound wave at frequencies 100 kHz or greater. For example, the piezoelectric material may be capable of generating ultrasound waves at 100 kHz to 500 kHz. The ultrasonic imaging resolution may be inversely proportional to the ultrasonic wavelength, or proportional to the ultrasonic frequency being used. For example, the wavelength of water or mud is approximately 15 mm at 100 kHz. As a result, the ultrasonic image obtained would have a resolution of approximately 15 mm.

Referring to FIG. 5A, an ultrasonic transducer 401 is shown comprising a disk-shaped transducer body 402. Excitation of the transducer body 402 having a disk-shaped geometry may result in low signal to noise ratios between thickness excitation, which is the source of the signal, and lateral excitation, which superimposes on the thickness signal as noise. For illustration purposes, the nominal voltage constants for disk-shaped transducers made from PZT or Lead Metaniobate excited at the transducer's thickness resonance with a pulse-echo signal are shown in Table 1, where the thickness mode excitation is orthogonal to the upper and lower surfaces of a disk-shaped transducer body (shown in FIG. 5A as arrow 3) and lateral mode excitation (i.e. radius mode excitation) is in the radial direction (shown in FIG. 5A as arrows 1 and 2).

TABLE 1

|  | PZT | Lead Metaniobate |
| --- | --- | --- |
| Thickness excitation ($10^{-12}$ m/V) | 300-600 | 70-90 |
| Lateral excitation ($10^{-12}$ m/V) | 100-250 | 0-10 |

In comparison with the PZT transducer, the Lead Metaniobate transducer may have a very low lateral excitation value. In certain embodiments, a transducer composed of Lead Metaniobate may be excited with a nearly pure thickness excitation mode, with minimal superposition of the lateral mode. In other words, the signal-to-noise ratio of a Lead Metaniobate transducer may be from 10:1 to a nearly non-existent noise signal. However, due to the limited thickness signal generated, the Lead Metaniobate transducer may be less effective that a PZT transducer. For example, a Lead Metaniobate transducer may have limited application where a large signal amplitude is required, such as in a borehole filled with mud, which causes the ultrasounds to attenuate substantially.

On the other hand, the PZT transducer may have a large signal amplitude, but also have a much smaller signal-to-noise ratio caused by superposition of the lateral excitation. For example, in certain embodiments, a disk-shaped transducer composed of PZT may have a signal-to-noise ratio of from about 3:1 to about 9:1. However, as discussed herein, the lateral excitation mode of the PZT transducer may be reduced and/or effectively suppressed by changing its geometry.

Referring now to FIG. 5B, a top-view of the ultrasonic transducer 401 of FIG. 5A is shown comprising the disk-shaped transducer body 402 having a transducer circumference 405, according to certain embodiments. In certain embodiments, a first portion 403 of the transducer body 402 may be removed to create a first edge 404 disposed on the transducer body 402, as illustrated in FIG. 4C. For example, in certain embodiments, the first edge 404 may be created by cutting, shearing, or otherwise removing a portion of the transducer body 402. The first edge 404 intersects and interrupts the transducer circumference 405, creating a radial portion 406 of the transducer body 402. As shown in FIG. 5D, a second portion 408 of the transducer body 402 may be removed to create a second edge 406. In certain embodiments, the resulting second edge 406 may be separated from the first edge 404 by an angle α. For example, the first edge 404 may define a first plane 414 and the second edge 406 may define a second plane 416, where the first plane 414 and the second plane 416 create an angle α of no less than 3 degrees.

Referring back to FIG. 4A, as a result of the first edge 304 and the second edge 306, in certain embodiments, the transducer body 302 may comprise a first radial section 310 and a second radial section 312 defined at the perimeter of the transducer body 300, where the first radial section 310 has a shorter arc length than the second radial section 312. As a result of interrupting the radial portions of the transducer body 302, in certain embodiments, the lateral excitation mode (i.e. radius mode) may be substantially suppressed by the geometry of the transducer body 302. For example, in certain embodiments comprising a first and second slanted edges 304, 306, the suppressed lateral excitation mode may reduce the noise, and result in a signal-to-noise ratio not less than 8:1.

In addition, in certain embodiments, the transducer body 302 may have a variable width defined between the slanted first and second edges 304, 306. Due to this non-uniform width, no additional width excitation mode may be introduced by the transducer body 302.

Referring now to FIG. 6, an ultrasonic transducer 600 is shown comprising a transducer body 602, comprising a first edge 604 and a second edge 606 slanted toward each other. In certain embodiments, the transducer body 602 may comprise a third edge 608 disposed on the transducer body 602. In certain embodiments, the third edge 608 may intersect or interrupt a radial section disposed between the first and second edges 604, 606. For example, in certain embodiments, a first radial segment 618 may be disposed on the transducer body 602 perimeter between the third edge 608 and the first edge 604. In addition, in certain embodiments, a second radial segment 619 may be disposed on the transducer body 602 perimeter between the third edge 608 and the second edge 608.

In certain embodiments, the first and second edges 604, 606 may create an angle α that is no less than 3 degrees. For example, in certain embodiments, the angle α may be from 3 degrees to 177 degrees. In another example, the angle α may be from 3 degrees to 90 degrees. In certain embodiments, the first, second, and third edges 604, 606, 608 may be planar. For example, the first edge 604 may define a first plane 614, the second edge 606 may define a second plane 616, and the third edge 608 may define a third plane 609.

As shown in FIG. 6, the third edge 608 may be disposed opposite a first shorter radial section 610. However, in certain embodiments, the third edge 608 may be disposed opposite a longer radial section, such as the second radial section 312 shown in FIG. 4A.

As a result of interrupting the radial portions of the transducer body 602, in certain embodiments, the lateral excitation mode (i.e. radius mode) may be substantially suppressed by the geometry of the transducer body 602. In addition, in certain embodiments, the radius excitation mode may be further suppressed by additional interruption of the radial portions of the transducer body 602 with the third edge 608. Thus, in certain embodiments, the ultrasonic transducer 600 comprising three edges may have a reduced noise resulting from the radius excitation mode as compared to an ultrasonic transducer comprising two edges.

In addition, in certain embodiments, the transducer body 602 may have a variable width defined between the slanted first and second edges 604, 606. Due to this non-uniform width, no additional width excitation mode may be introduced by the transducer body 602.

Referring now to FIG. 7, an ultrasonic transducer 700 is shown comprising a transducer body 702, comprising a first edge 704 and a second edge 706 slanted toward each other similar to that described in FIGS. 4A and 6. In certain embodiments, the transducer body 702 may comprise a third edge 708 disposed on the transducer body 702 and a fourth edge 710 disposed on the transducer body 702 opposite the third edge 708.

In certain embodiments, the third edge 708 may intersect or interrupt a radial section disposed between the first and second edges 704, 706. For example, in certain embodiments, a first radial segment 718 may be disposed on the transducer body 702 perimeter between the third edge 708 and the first edge 704. In addition, in certain embodiments, a second radial segment 719 may be disposed on the transducer body 702 perimeter between the third edge 708 and the second edge 706.

In certain embodiments, the fourth edge 710 may intersect or interrupt a second radial second disposed between the first and second edges 704, 706. For example, in certain embodiments, a third radial segment 721 may be disposed on the transducer body 702 perimeter between the fourth edge 710 and the first edge 704. In addition, in certain embodiments, the fourth edge 710 may intersect with an adjacent edge. For example, the fourth edge 710 may intersect with the second edge 706 at an intersection point 724.

In certain embodiments, the first edge 704 may define a first plane 714, the second edge 706 may define a second plane 716, the third edge 708 may define a third plane 718 and/or the fourth edge 710 may define a fourth plane. In certain embodiments, the first and second edges 704, 706 may create an angle α that is no less than 3 degrees. In certain embodiments, the third and fourth edges 708, 710 may create an angle β that is no less than 3 degrees. In certain embodiments, angle α and angle β may be defined independently of one another.

In certain embodiments, each of the four planar edges 704, 706, 708, and 710 may connect with or intersect neighboring planar edge(s), such that no radial segment is disposed between the planar edges. For example, in certain embodiments, each of the planar edges 704, 706, 708, 710 may connect with or intersect both of the neighboring planar edges, such that the transducer body 702 comprises no radial edge.

As a result of interrupting the radial portions of the transducer body 702, in certain embodiments, the lateral excitation mode (i.e. radius excitation mode) may be substantially suppressed by the geometry of the transducer body 702. In addition, in certain embodiments, the radius excitation mode may be further suppressed by additional interruption of the radial portions of the transducer body 702 with the third edge 708 and the fourth edge 710. Thus, in certain embodiments, the ultrasonic transducer 700 comprising four edges may have a reduced noise resulting from the radius excitation mode as compared to an ultrasonic transducer comprising two or three edges. In certain embodiments, the third and fourth edges 708, 710 may further reduce the symmetry of the transducer body 702. As a result, the lateral excitation or radius excitation modes of the ultrasonic transducer 700 may be further reduced as compared to that of an ultrasonic transducer having two or three edges.

In addition, in certain embodiments, the transducer body 702 may have a variable width defined between the slanted first and second edges 704, 706. Due to this non-uniform width, in certain embodiments, no additional width excitation mode may be introduced by the transducer body 702.

While the present disclosure discusses altering the geometry of a transducer by adding two to four planar edges in various arrangements, the disclosure does not intend to limit the number of planar edges. As such, more than four edges may be disposed on the transducer of the present disclosure while keeping to the claimed subject matter.

The transducer body may be produced by providing a transducer body and processing the transducer body using by removing portions of the transducer body to form edges (i.e., a removing process). For example, in certain embodiments, the edges may be formed by cutting, shearing, trimming, or otherwise mechanically removing a portion of the transducer body. In certain embodiments, a generally cylindrical transducer body may be provided and processed to create edges. However, a transducer body comprising a face having other geometries may be provided and processed. For example, in certain embodiments, a transducer body comprising a face having a generally rectangular, trapazoidal, diamond, octogonal, oval, egg-shaped, or any number of additional geometries my be provided and further processed, as would be recognized by one of ordinary skill with the benefit of the present disclosure.

In certain embodiments, the transducer body may be produced using a molding process, for example extrusion molding, injection molding, compression molding, and/or matrix molding, to form a transducer having two or more edges. For example, processing the transducer body using a molding process may reduce the amount of material lost as compared with a processing the transducer build using a removing process.

In certain embodiments, a method of producing an ultrasonic transducer, comprises providing a transducer having a disk-shaped body with a circular circumference; forming a first edge of the transducer; and forming a second edge of the transducer opposite the first edge, wherein the first edge and the second edge interrupts the radius.

In certain embodiments, a method of ultrasonic imaging a formation may comprise providing a transducer, which comprises a transducer body comprising a piezoelectric material, wherein the transducer body comprises at least one radial portion, wherein the transducer body has an upper surface and a lower surface; a first transducer edge disposed on the transducer body; and a second transducer edge disposed on the transducer body, wherein the first transducer edge and the second transducer edge interrupt at least one radial portion; exciting the transducer with a first electrode coated on the upper surface and a second electrode coated on the lower surface; causing the transducer to emit ultrasound waves into an environment; receiving ultrasound waves reflected back from the environment; and determining a characteristic of the environment based on the received ultrasound waves.

EXAMPLES

Figure 8:
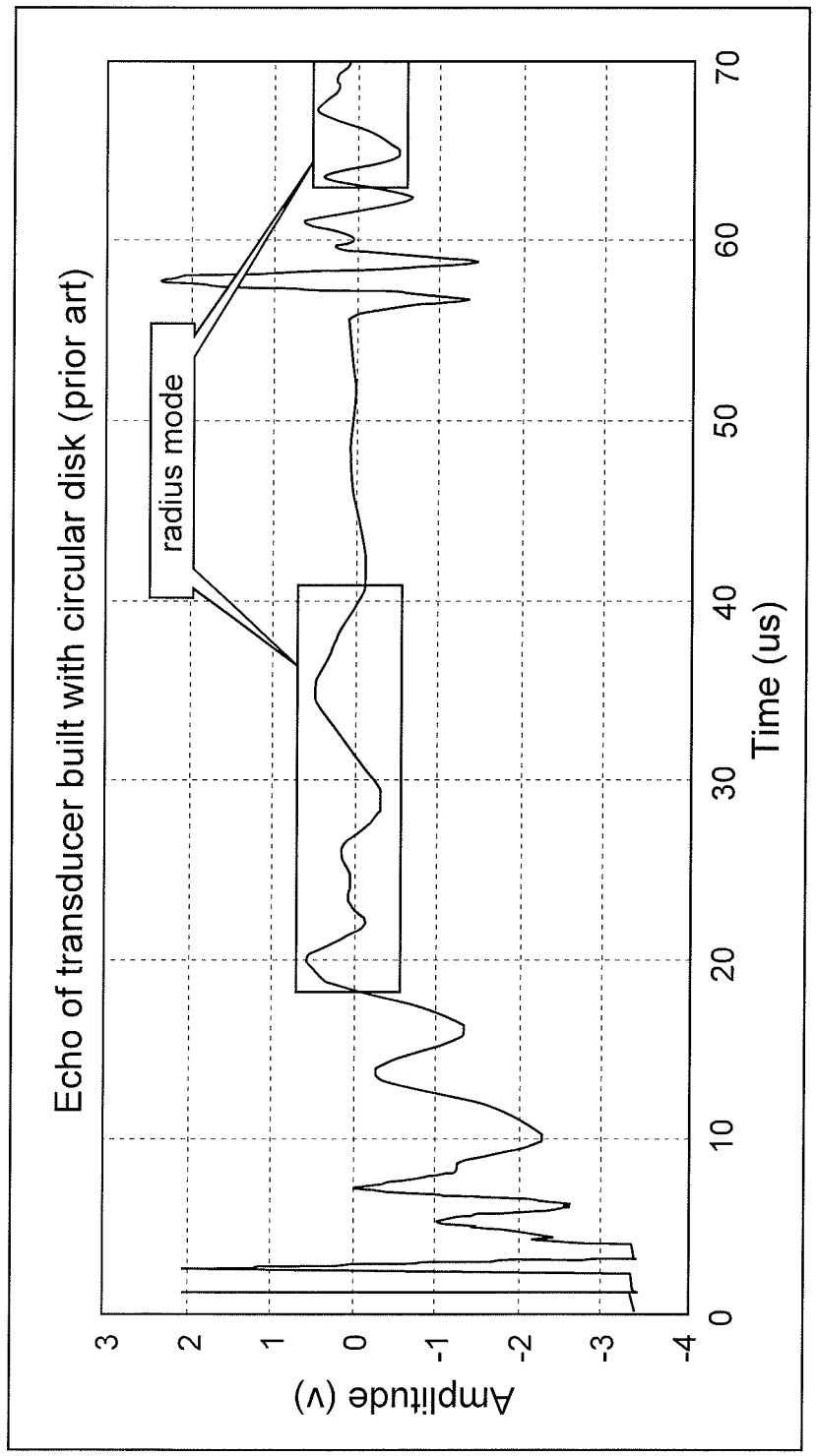
FIG. 8 is a graph of the amplitude of a received signal over time, as excited from a disk-shaped transducer body, according to aspects of the present disclosure.
Figure 9:
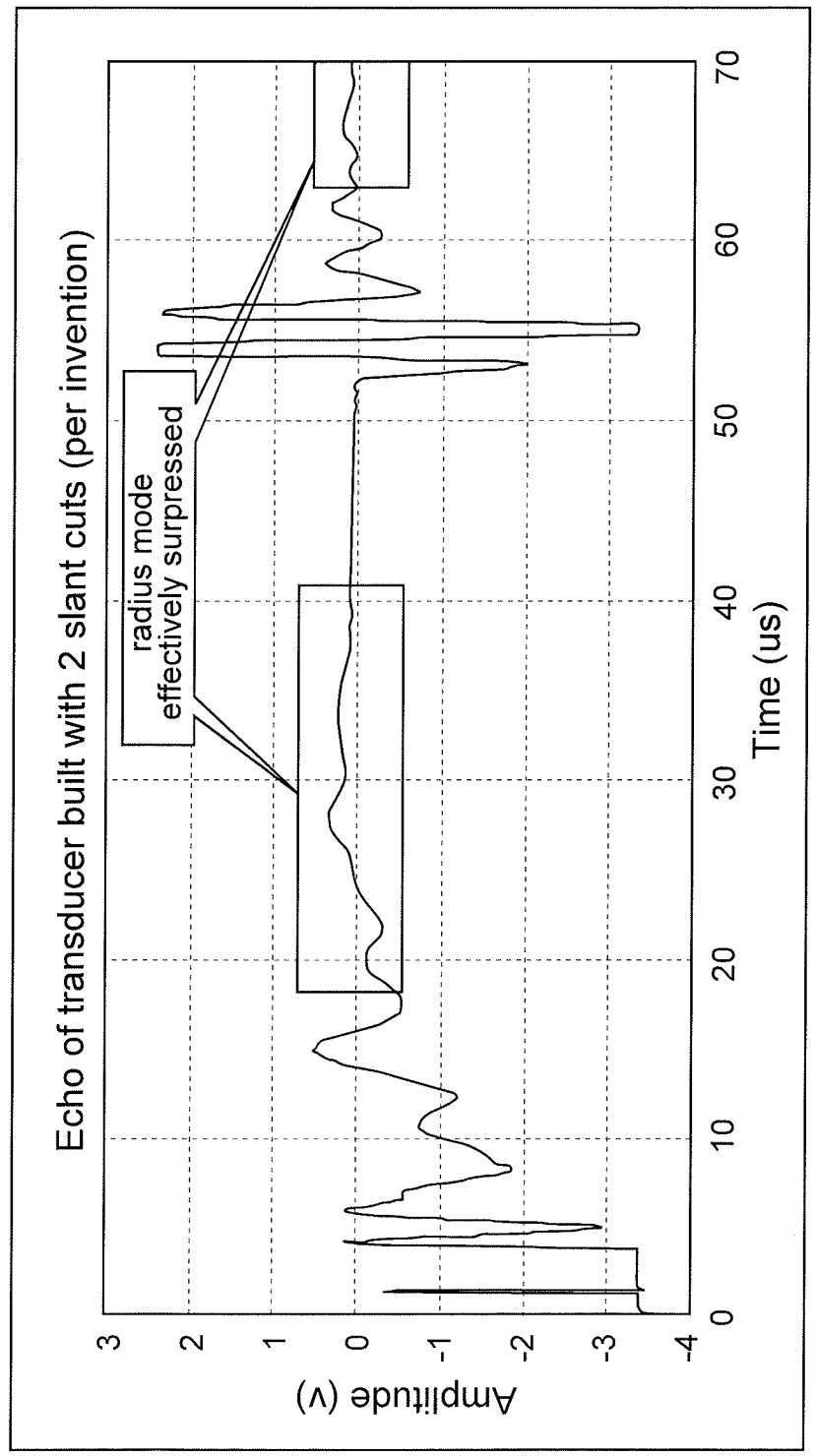
FIG. 9 is a graph of the amplitude of a received signal over time, as excited from a transducer body comprising two slanted edges, according to aspects of the present disclosure.

Referring now to FIGS. 8 and 9, graphs of the signal received by two different transducers are shown over time. Each transducer was placed into a water tank and excited with a 2 microsecond square pulse. The generated ultrasound pulses propagated in the water and were reflected back by a steel block placed 1.5 inches away from the transducer.

FIG. 8 shows a graph of the signal excited by and subsequently reflected back to an ultrasonic transducer comprising a disk-shaped transducer body composed of PZT (similar to that shown in FIGS. 5A and 5B). The noise due to the radius mode excitation can be seen in the signal fluctuation from 20 microseconds to 40 microseconds.

In contrast, FIG. 9 shows a graph of the signal excited by and subsequently reflected back to an ultrasonic transducer with a transducer body comprising two slanted edges (similar to that shown in FIG. 4A). The radius mode of the transducer comprising two slanted edges is substantially reduced as compared to the noise in FIG. 8. For example, from 20 microseconds to 40 microseconds, the received signal reflected from the stationary steel block is much more steady, as compared to the same time frame in FIG. 8. The noise is much smaller due to the suppression of the radius mode excitation. This suppression of the radius mode substantially increases the signal-to-noise ratio in downhole applications, where the mud has a large attenuation to the emitted ultrasounds.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present disclosure. Also, the terms in the claims have their plain, ordinary meaning unless otherwise explicitly and clearly defined by the patentee. The indefinite articles "a" or "an," as used in the claims, are defined herein to mean one or more than one of the element that it introduces.

What is claimed is:

1. An ultrasonic transducer, comprising:
    a transducer body, wherein the transducer body comprises:
        a first face disposed on the transducer body;
        a second face disposed on an opposite side of the transducer body from the first face;
        a first radial section and a second radial section defined at a perimeter of the transducer body; and
        a piezoelectric material;
    a first transducer edge disposed on the transducer body;
    a second transducer edge disposed on the transducer body, wherein the first edge is disposed on the transducer body substantially opposite from the second edge, and wherein the first transducer edge and the second transducer edge intersect the perimeter of the transducer body, and wherein the first transducer edge and the second transducer edge form an angle no less than 3 degrees; and
    wherein the first transducer edge and the second transducer edge are slanted towards each other such that the transducer body has a variable width defined between the first transducer edge and the second transducer edge, and wherein a first radial section length of the first radial section is shorter than a second radial section length of the second radial section.

2. The ultrasonic transducer of claim 1, further comprising a third transducer edge disposed on the transducer body, wherein the third transducer edge intersects the perimeter of the transducer body.

3. The ultrasonic transducer of claim 1, further comprising a third transducer edge disposed on the transducer body and a fourth transducer edge disposed on the transducer body, wherein the third transducer edge and the fourth transducer edge are separated by an angle no less than 3 degrees.

4. The ultrasonic transducer of claim 1, wherein the transducer body comprises Lead Zirconate Titanate.

5. The ultrasonic transducer of claim 1, wherein the transducer body comprises a generally cylindrical geometry and the perimeter of the transducer body comprises a circumference.

6. The ultrasonic transducer of claim 1, further comprising a first electrode connected to the first face and a second electrode connected to the second face.

7. The ultrasonic transducer of claim 6, wherein the transducer body exhibits a suppressed lateral mode when excited by the first electrode and the second electrode.

8. A method of producing an ultrasonic transducer, comprising:
providing a transducer body, wherein the transducer body comprises:
a first face disposed on the transducer body;
a second face disposed on an opposite side of the transducer body from the first face; and
a first radial section and a second radial section defined at a perimeter of the transducer body;
forming a first edge disposed on the transducer body and intersecting the perimeter of the transducer body;
forming a second edge disposed on the transducer body and intersecting the perimeter of the transducer body, wherein the first edge and the second edge form an angle no less than 3 degrees; and
slanting the first edge and the second edge towards each other such that the transducer body has a variable width defined between the first edge and the second edge, and wherein a first radial section length of the first radial section is shorter than a second radial section length of the second radial section.

9. The method of claim 8, wherein the transducer body comprises a generally cylindrical geometry.

10. The method of claim 8, wherein the transducer body comprises Lead Zirconate Titanate.

11. The method of claim 8, further comprising forming a third edge disposed on the transducer body.

12. The method of claim 8, further comprising forming a third edge disposed on the transducer body and forming a fourth edge disposed on the transducer body.

13. The method of claim 12, wherein the third edge and the fourth edge are separated by an angle no less than 3 degrees.

14. The method of claim 8, wherein forming the first edge further comprises removing a first portion of the transducer body, and forming the second edge further comprises removing a second portion of the transducer body.

15. The method of claim 8, wherein forming the first edge further comprises molding the first edge into the transducer body, and forming the second edge further comprises molding the second edge into the transducer body.

16. A method of ultrasonic imaging a formation, comprising:
providing a transducer, comprising:
a transducer body comprising a piezoelectric material, wherein the transducer body comprises:
a first face disposed on the transducer body;
a second face disposed on an opposite side of the transducer body from the first face;
a first radial section and a second radial section defined at a perimeter of the transducer body;
a first transducer edge disposed on the transducer body and intersecting the perimeter of the transducer body; and
a second transducer edge disposed on the transducer body and intersecting the perimeter of the transducer body, wherein the first transducer edge and the second transducer edge form an angle no less than 3 degrees, wherein the first transducer edge and the second transducer edge are slanted towards each other such that the transducer body has a variable width defined between the first transducer edge and the second transducer edge, and wherein a first radial section length of the first radial section is shorter than a second radial section length of the second radial section;
exciting the transducer with a first electrode connected to the first face and a second electrode connected to the second face;
causing the transducer to emit ultrasound waves into an environment;
receiving ultrasound waves reflected back from the environment; and
determining a characteristic of the environment based on the received ultrasound waves.

17. The method of claim 16, wherein the transducer further comprises a third transducer edge disposed on the transducer body.

18. The method of claim 16, wherein the transducer further comprises a third transducer edge and a fourth transducer edge disposed on the transducer body, wherein the third transducer edge and the fourth transducer edge are separated by an angle no less than 3 degrees.

19. The method of claim 16, wherein exciting the transducer further comprises suppressing lateral mode of the transducer.

20. The method of claim 16, wherein the transducer body comprises Lead Zirconate Titanate.

* * * * *